United States Patent [19]

Chaminant et al.

[11] Patent Number: 4,737,237

[45] Date of Patent: Apr. 12, 1988

[54] PROCESS FOR PRODUCING A BURIED STRIP SEMICONDUCTOR LASER WITH OR WITHOUT A DEFRACTIVE NETWORK

[76] Inventors: Guy Chaminant, 64 Bis, rue de Paris, 91570 Bievres; Josette Charil, 30, rue d'Arthelon, 92190 Meudon; Jean-Claude Bouley, 35 Avenue du Docteur, 94110 Arcueil, all of France

[21] Appl. No.: 910,499

[22] Filed: Sep. 23, 1986

[30] Foreign Application Priority Data

Sep. 24, 1985 [FR] France ............................ 85 14123

[51] Int. Cl.$^4$ ...................... H01L 21/306; B44C 1/22; C03C 15/00; C03C 25/06
[52] U.S. Cl. .................... 156/649; 156/653; 156/657; 156/662; 437/129; 437/228; 357/17; 372/50
[58] Field of Search .............. 29/569 L; 156/649, 652, 156/653, 655, 657, 659.1, 662; 148/175, 1.5; 357/16, 17, 30, 56; 372/43, 44, 45, 46, 50; 437/23, 55, 129, 228, 235

[56] References Cited

U.S. PATENT DOCUMENTS 4,213,805 7/1980 Tsukada ........................ 156/649 X
4,468,850 9/1984 Liau et al. ........................ 29/569

FOREIGN PATENT DOCUMENTS 0002827 11/1979 European Pat. Off.
57-91581 6/1982 Japan ................................ 29/569 L

OTHER PUBLICATIONS

Electronics Letters, vol. 20, No. 21, 11 Oct. 1984, pp. 850-851, Staines, Middlesex, GB; R. Blondeau et al.: "CW Operation of GaInAsP Buried Ridge Structure Laser at 1.5 mum Grown by LP-MOCVD" * Sections: Introduction et Device Fabrication; FIG. 1 *.
Electronics Letters, vol. 20, No. 21, 11 Oct. 1984, pp. 856-857, Staines, Middlesex, GB; T. L. Koch et al.: "Low-Threshold High-Speed 1-55 Mum Vapour Phase Transported Buried Heterostructure Lasers (VPTBH)" * p. 856; FIG. 1 *.
Applied Physics Letters, vol. 45, No. 12, Dec. 1984, pp. 1272-1274, Woodbury, New York, U.S.; W. T. Tsang et al.: "Heteroepitaxial Ridge-Overgrown Distributed Feedback Laser at 1.5 mum" *p. 1272; FIG. 1 *.
Electronics Letters, vol. 20, No. 14, 5 Jul. 1984, pp. 595-596, Staines, Middlesex, GB; M. Kitamura et al.: "Low-Threshold and High-Temperature Single-Longitudinal-Mode Operation of 1.55 Mum-Band DFB-DC-PHB LDs" * p. 595; FIG. 1 *.
Applied Physics Letters, vol. 38, No. 5, Mar. 1981, pp. 301-303, New York, U.S.; P. C. Chen et al.: "Embedded Epitaxial Growth of Low-Threshold GaInAsp/InP Injection Lasers" p. 301; FIG. 1 *.

*Primary Examiner*—William A. Powell
*Attorney, Agent, or Firm*—Pearne, Gordon, McCoy & Granger

[57] ABSTRACT

For burying the active strip, two narrow bands are etched on either side of the strip and localized epitaxy repeat takes place on said two bands, which makes it possible to work at lower temperatures. Moreover, the substrate and confinement layer are of type p and the epitaxy repeat layer of highly doped type n+. The guide layer can be etched to constitute a defractive network.

7 Claims, 2 Drawing Sheets

PROCESS FOR PRODUCING A BURIED STRIP SEMICONDUCTOR LASER WITH OR WITHOUT A DEFRACTIVE NETWORK

BACKGROUND OF THE INVENTION

The present invention relates to a process for producing a buried strip semiconductor laser and to a laser obtained by this process. It has a general application in optical telecommunications.

The technical field of the invention is that of $Ga_{1-x}In_xAs_{1-y}P_y$ or InP semiconductor laser sources for single-mode fibre links. The invention more particularly relates to a structure having a so-called buried strip geometry, which is a structure with a low threshold current. This structure has interesting advantages compared with the prior art structures. It firstly makes it possible to minimize the leakage currents appearing at high operating temperatures and/or high optical powers. It also permits a simple production process in two instead of three epitaxy stages, such as are required in most known structures.

The attached FIG. 1 shows a known structure with distributed feedback and buried strip. This is a Japanese structure of the NEC Corporation described in the article entitled: "Low threshold and high temperature single longitudinal mode operation of 1.55 μm—Band DFB-DC-PBH-LD's" by M. Kitamura et al published in Electronics Letters, July 5 1984, pp 596–597. This structure comprises a n-doped InP substrate 10, a InGaAsP active layer 12, a InGaAsP guide layer 14, a p-doped InP confinement layer 16, a p-doped -InP layer 18, a n-doped Inp layer 20, a p-doped InP layer 22 and finally a p-doped InGaAsP contact layer 24.

The distributed feedback structure or DFB comprises a holographic network 28 of the first or second order (spacing 0.24 or 0.48 μm) etched in the guide formed by the layer 14 located just above the active layer 12, which functions at a wavelength of 1.55 μm. The electronic confinement of the current lines in the strip is obtained with the aid of crescent-shaped p and n-like layers 26, located on either side of the active zone 12 of the laser.

The best results at a wavelength of 1.3 and 1.55 μm were obtained with this structure: threshold current 20 mA and power of 10 mW per face up to 60°C.

This structure is produced in three epitaxy stages: the first for depositing the two quarternary layers 12, 14, the second for repeating the epitaxy of a InP layer 16 on the network previously etched in layer 14, and the third for the epitaxy of the n and p type InP blocking layers 20, 22 and that of the InGaAsP contact layer 24.

Reference is made to the high degree of precision required for the positioning of the blocking layers with respect to the active zone. It is also pointed out that this structure can only be produced by liquid phase epitaxy.

W. T. TSANG et al of Bell Laboratories recently published an article entitled "Heteroepitaxial ridge-overgrown distributed feedback laser at 1.5 μm" in Appl. Phys. Lett., 45, Dec. 15, 1984, pp 1272–1275, where a description is given of a so-called DFB-HRO structure (Distributed Feedback-Heteroepitaxial Ridge Overgrown), which can be an interesting replacement solution. The corresponding structure is illustrated in FIG. 2. It comprises a n-doped InP substrate 30, a n-doped InP buffer layer 32, a n-doped GaInAsP active layer 34, a p-doped GaInAsP anti-redissolving layer 36 in which is provided a defractive network 38, a $SiO_2$ dielectric film 40 having an opening in which has been formed a p-doped InP band (Ridge Overgrowth) 42, said band being covered by a metal coating.

In such a structure, the active strip is not really buried. The electric confinement of the current is obtained by the opening (5 μm wide) made in the silica layer. The optical light guide produced in the active layer is much more effective than in the buried structure of FIG. 1. Therefore the threshold currents are much higher.

It should be noted that this structure is produced in two epitaxy stages:

the first for depositing the three InP layers and the quaternary layers, the second for the p-doped InP confinement layer obtained by localized epitaxy through the $SiO_2$ mask 40 previously deposited on layer 36.

Another structure is known from the publication of the present Applicants and is entitled: "1.55 μm strip buried Schottky laser" published in "Proceedings of the 9th IEEE International Semiconductor Laser Conference", Aug. 7/10 1984. This structure is shown in FIG. 3 and comprises a n+—doped InP substrate 50, a n-doped InP confinement layer 52, an approximately 2 μm wide strip formed from a GaInAsP active layer 54 and a Ga InAsP guide layer 55, said strip being buried in a p-doped InP layer 56. This layer is covered with a GaInAs layer 58 in the form of an approximately 5 μm wide mesa. The assembly is covered with a layer of titanium 60 and gold 62.

This so-called SBH structure (strip buried heterostructure) is formed in two epitaxy stages. The first makes it possible to deposit the three layers 52, 54, 55, respectively of InP and GaInAsP of composition corresponding to a wavelength of 1.55 μm and GaInAsP at 1.3 μm, said layers then being etched by selective etching in strip form. The second epitaxy cycle makes it possible to grow again on the strip the type p InP layer 56 and a contact layer 58. The confinement of the current on the mesa is then obtained by depositing on the apex a Schottky-type strip.

The SBH structure makes it possible to produce in this way a buried strip DFB laser without any supplementary complication. It is merely necessary to additionally etch a holographic network in the layer 55 functioning at 1.3 μm and then repeat epitaxy taking care not to redissolve either the network or the strip.

A DFB-SBH laser produced according to this method is described in the article entitled "Laser $Ga_xIn_{1-x}As_{1-y}P_y$ 1.55 μm a contre-reaction distribuee" by P. CORREC et al in Comptes-Rendus des Journees Nationales de l'Optique Guidee, Mar. 20/21 1985, Issy-les-Moulineaux, France.

Although being satisfactory in certain respects, all these structures suffer from disadvantages.

The DC PBH type strip structure (FIG. 1) apply to DFB lasers is very difficult to realize, particularly due to the three successive epitaxies and the accuracy required for the etching thicknesses and depths.

The HRO-DFB-type structure (FIG. 2) is simpler than the first, but leads to higher threshold currents (50–100 mA instead of 20–40 mA) due to the limited electronic and optical lateral confinement.

The SBH structure gives rise to production difficulties, if it is wished to obtain a distributed Bragg network, due to the liquid phase epitaxy leading to a partial redissolving of the guide layer during epitaxy repeat. There are also high leakage currents in the p-n junctions of the InP on either side of the strip, starting from a total current of 80 mA. Thus, there is a limitation to the emission power of the laser (3 mW at 60° C. instead of 10 mW with the DC-PBH structure). Limitations of the same order of magnitude are also observed in lasers produced by MO-CVD epitaxy ("Metal-Organic, Chemical Vapor Deposition").

SUMMARY OF THE INVENTION

The object of the present invention is to obviate these disadvantages by proposing a simple process making it possible to obtain a buried strip laser structure by liquid or vapour epitaxy with a possibility of obtaining a distributed feedback, said laser having a low threshold current and a high emission power.

The invention is based on the two following essential points:

(1) the use of localized epitaxy for burying the active strip (and optionally the network), which leads to a lower growth temperature than with a normal epitaxy (500° C. instead of 600° C.), (2) the use of a p-type substrate for repeating the epitaxy, which makes it possible to only use a single very highly doped InP layer ($5.10^{18}$ cm$^{-3}$) for effectively limiting the leakage currents in the lateral p-n junctions.

It is known that the localized epitaxy of a strip a few $\mu$m wide leads to a much higher growth rate than in the case of epitaxy over the entire surface of a substrate. The solution excess in the bath precipitates on regions with small dimensions. This phenomenon is referred to in the article entitled "Embedded epitaxial growth of low-threshold GaInAsP/InP injection laser" by P. C. CHEN et al published in Appl. Phys. Lett., 38, No. 5, Mar. 1, 1981, pp 301-303.

This phenomenon leads to a very high degree of supersaturation of the bath and consequently makes it possible to carry out epitaxy at low temperature. Growths were obtained at 500° C. instead of 600° to 630° C. in the usual case. This growth temperature decrease makes it possible to obviate the problems of redissolving of the guide layer referred to hereinbefore and to limit deformations and deteriorations of the defractive network, currently observed at high temperatures.

The use of a p-type substrate in place of a n-type substrate in the SBH structure also leads to the reepitaxy of only a single highly doped n+InP layer for burying the strip. In this case, a contact layer is superfluous, bearing in mind the low contact resistance values measured on the InP-n+layers. Moreover, it is very important to note that a highly conductive layer leads to a significant reduction to the leakage currents in the lateral p-n junctions. Thus, in the conventional SBH structure, an important saturation of the emitted power appears for a current of 80 mA, beyond which the current passes into the lateral homojunctions. It can be demonstrated that the saturation current $I_{sat}$ is linked with the internal potential difference of the homojunction, i.e. $V_h$, and the heterojunction, i.e. $V_H$ by the relation:

$$I_{sat} = V_h - V_H / R_{eq}$$

in which $R_{eq}$ is the resistance between the contact and the buried strip. The experimental values of $V_h - V_H$ are approximately 400 mV and those of $R_{eq}$ calculated from the doping and thickness of the InP-p layer approximately 5Ω which leads to calculated values for $I_{sat}$ close to the experimental values.

The use of a type n+layer therefore leads, bearing in mind the high mobility of the electrons, to a resistance $R_{eq}$ at least 10 times lower and consequently to a saturation current 10 times higher.

More specifically the present invention relates to a process for producing a buried strip semiconductor laser in which:

a heterostructure is formed by a first epitaxy consisting of depositing on a substrate S a confinement layer $Q_O$ having a first doping type, an active layer $Q_1$ and a guide layer $Q_2$, a dielectric layer is deposited on the final layer $Q_2$, part of this layer is removed leaving it on the zone where it is wished to form an active strip, layers $Q_2$ and $Q_1$ are etched down to the confinement layer $Q_O$, which leaves behind a strip, epitaxy is repeated on the thus etched structure to bury the strip in a semiconductor layer $Q_3$ having a second doping type opposite to the first, wherein substrate S and confinement layer $Q_O$ are p-doped, whereas the semiconductor used for epitaxy repeat $Q_3$ is highly n+doped, in the dielectric layer are formed two narrow, parallel openings on either side of the zone where it is wished to obtain the strip and the layers $Q_2$ and $Q_1$ are etched through these two openings, the dielectric is removed above the strip, but is maintained on the rest of the structure on either side of the two openings, epitaxy is repeated in the two thus etched narrow zones and is performed at a temperature below that at which the first epitaxy is performed.

The invention also relates to a laser obtained by the aforementioned process. This laser is of the type comprising a heterostructure formed by a substrate, a confinement layer having a first doping type and a strip formed from an active layer and a guide layer, said strip being buried in a layer having a second doping type which is opposite to the first, wherein the substrate and confinement layer are p-doped and the layer in which the strip is buried is n+-doped, the buried strip is surrounded by two narrow bands of material $Q_3$ obtained by localized repeat epitaxy and a dielectric layer covers the guide layer $Q_2$ outside the gap formed by the two bands and the strip.

BRIEF DESCRIPTION OF THE DRAWINGS

The invention is described in greater detail hereinafter relative to non-limitative embodiments and the attached drawings, wherein show.

DETAILED DESCRIPTION OF THE INVENTION

Figure 1:
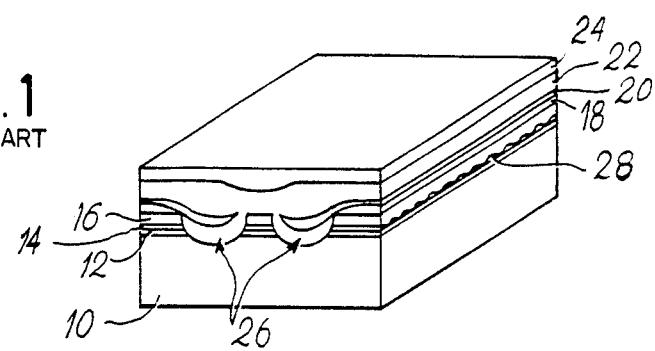
FIG. 1, already described, a prior art DC-PBH laser.
Figure 2:
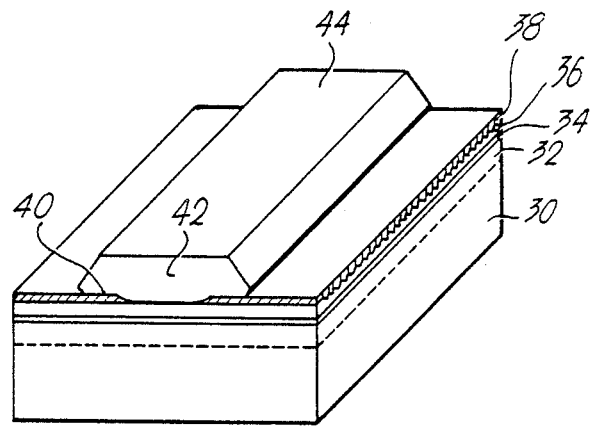
FIG. 2, already described, a prior art HRO laser.
Figure 3:
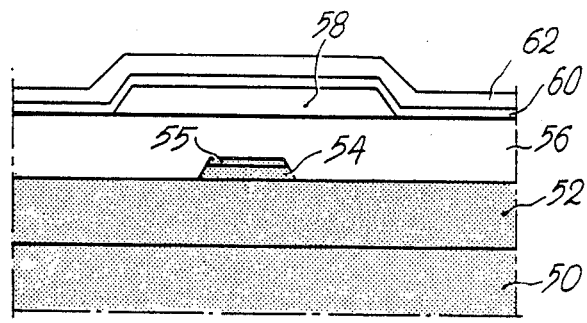
FIG. 3, already described, a prior art SBH laser.
Figure 4:
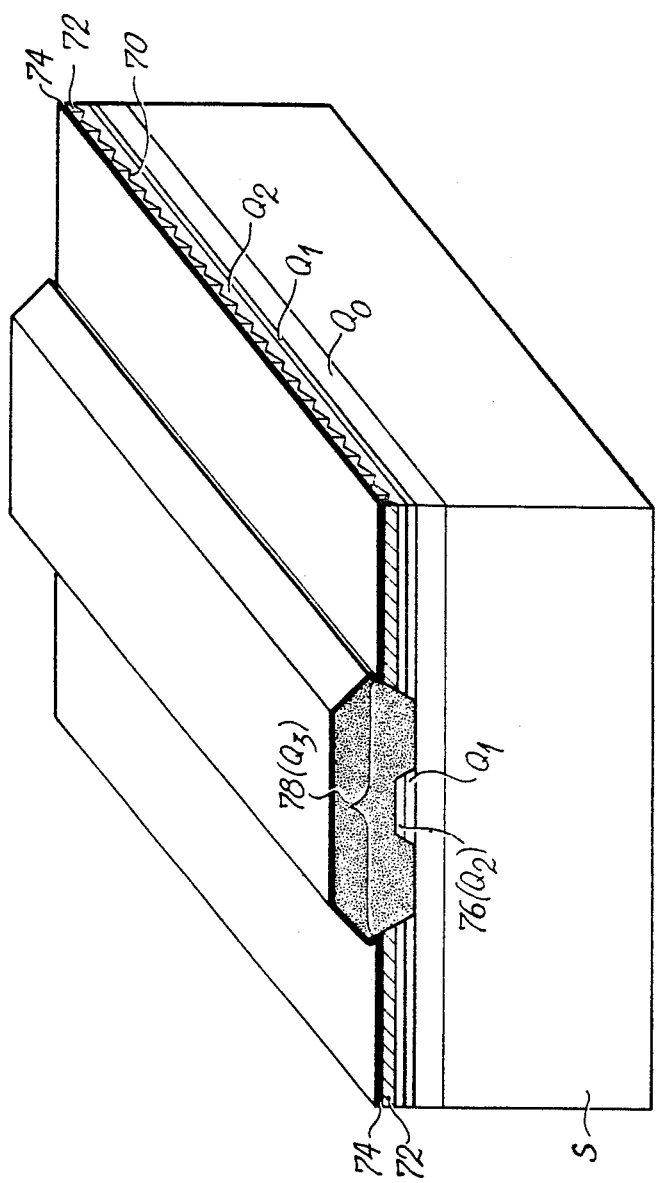
FIG. 4, an embodiment of a laser according to the invention.

The structure illustrated in FIG. 4 requires two epitaxies. In the first, three layers are deposited on a p+-type InP substrate S:

a p-type InP layer $Q_O$ doped between $5.10^{16}$ and $3.10^{17}$ cm$^{-3}$, a GaInAsP active layer $Q_1$ of composition corresponding to an emission wavelength of 1.55 or 1.3 $\mu$m, a GaInAsP guide layer $Q_2$ of composition corresponding to a wavelength 1.3 μm for a laser emitting at 1.5 μm or 1.15 μm for a laser emitting at 1.3 μm.

In the case of a DFB laser at 1.3 or 1.55 μm, a defractive network 70 of the first or second order is then etched by conventional methods in the guide layer $Q_2$.

This is followed by the deposition of a dielectric layer 72, preferably of $SiO_2$, or optionally $Si_3N_4$, with a thickness of 0.15 to 0.17 μm. Deposition takes place by plasma-assisted CVD over the entire surface of the network.

Two juxtaposed band-like openings are then etched in the silica with the aid of the same mask. The structure is then etched by chemical etching in order to selectively hollow out the two layers $Q_1$ and $Q_2$ down to the p-doped InP layer $Q_0$. In this way, in the two auaternary layers are defined a strip 76 of width $W_1$ equal to 1 or 2 μm, in the centre of an opening 78 of width $W_2$, whereof the value can be between 8 and 20 μm.

This is followed by the removal of the dielectric mask remaining at the apex of strip 76 and a second epitaxy of a n-doped InP layer takes place at between $10^{18}$ and $5.10^{18}$ cm$^{-3}$. Repeat epitaxy takes place at low temperature for the reasons indicated hereinbefore.

It is obvious that this structure and process may also be suitable for lasers without distributed feedback, i.e. lasers at 1.3 or 1.55 μm with a low threshold current (10–20 mA).

What is claimed is:

1. A process for producing a buried strip semiconductor laser comprising the steps of:

providing a heterostructure having a first epitaxy formed by depositing on a substrate (S), a confinement layer ($Q_0$) having a first doping type, an active layer ($Q_1$), and a guide layer ($Q_2$);

depositing a dielectric layer (72) on the guide layer ($Q_2$);

removing parts of said dielectric layer (72) so as to provide two narrow, parallel openings extending through said dielectric layer on either side of a zone where it is desired to provide said buried strip, said removing leaving a remaining portion of the dielectric layer (72) over said zone;

etching through said two openings the guide layer ($Q_2$) and the active layer ($Q_1$), down to the confinement layer ($Q_0$), so as to provide said buried strip having an apex with said portion of the dielectric layer remaining on the apex of said buried strip;

removing said remaining portion of said dielectric layer (72) at said apex of the buried strip, but maintaining said dielectric layer (72) adjacent to said two openings; and burying by a second epitaxy said buried strip in a semiconductor layer ($Q_3$) haivng a second doping type opposite to the said first doping type, wherein the substrate (S) and the confinement layer ($Q_0$) are p-doped, and whereas the semiconductor used for said semiconductor layer ($Q_3$) is highly n+doped, said second epitaxy being performed at a temperature below that at which the first epitaxy was performed.

2. A process according to claim 1, wherein the guide layer ($Q_2$) is also etched to form a distributed defractive network.

3. A process according to claim 1, wherein the substrate is of p+-doped InP, the confinement layer of InP which is p-doped between $5.10^{16}$ and $3.10^{17}$ cm$^{-3}$, the active layer of GaInAsP and the guide layer of GaInAsP, whilst the InP epitaxy repeat layer is doped n+between $10^{18}$ and $5.10^{18}$ cm$^{-3}$.

4. A process according to claim 1, wherein said second epitaxy takes place at a temperature below 600° C.

5. A process according to claim 4, wherein said second epitaxy takes place at about 500°C.

6. A process according to claim 1, wherein said second epitaxy takes place in the liquid phase.

7. A process according to claim 1, wherein said second epitaxy takes place in the vapor phase.

* * * * *